US006333653B1

(12) United States Patent
Floyd et al.

(10) Patent No.: US 6,333,653 B1
(45) Date of Patent: Dec. 25, 2001

(54) SYSTEM AND METHOD FOR PHASE ALIGNMENT OF A PLURALITY OF CLOCK PULSES WHEN STARTING, STOPPING AND PULSING CLOCKS

(75) Inventors: Michael Stephen Floyd, Leander; Kevin F. Reick; Timothy Michael Skergan, both of Austin, all of TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/435,078

(22) Filed: Nov. 4, 1999

(51) Int. Cl.[7] .................................................. H03L 7/00
(52) U.S. Cl. ......................... 327/163; 327/155; 327/160; 327/244; 327/291
(58) Field of Search ..................................... 327/291, 293, 327/295, 298, 244, 245, 147, 151, 152, 153, 155, 160, 161, 162, 163, 271, 276, 277, 279, 284, 280

(56) References Cited

U.S. PATENT DOCUMENTS

| | | | | |
|---|---|---|---|---|
| 5,087,829 | * | 2/1992 | Ishibashi et al. | 327/158 |
| 5,945,862 | * | 8/1999 | Donnelly et al. | 327/278 |
| 5,999,027 | * | 12/1999 | Yamazaki | 327/161 |
| 6,044,122 | * | 3/2000 | Ellersick et al. | 375/360 |
| 6,067,334 | * | 5/2000 | Bostica et al. | 375/373 |

* cited by examiner

*Primary Examiner*—Timothy P. Callahan
*Assistant Examiner*—An T. Luu
(74) *Attorney, Agent, or Firm*—Volel Emile; Edmond A. DeFrank

(57) ABSTRACT

The present invention is embodied in a clock controller for generating and controlling the phase alignment of a plurality of ratioed sub-clocks. A master clock is preferably input to a clock splitter to provide a plurality of slave clocks. Phase holds, generated from the slave clocks, are then used to gate each of the slave clocks to produce ratioed clocks that produce phase aligned clock pulses at integer factors of the master clock frequency. The clock controller controls the ratioed clocks by processing commands to start, stop, or pulse the ratioed clocks.

23 Claims, 5 Drawing Sheets

SYSTEM AND METHOD FOR PHASE ALIGNMENT OF A PLURALITY OF CLOCK PULSES WHEN STARTING, STOPPING AND PULSING CLOCKS

BACKGROUND OF THE INVENTION

1. Field of the Invention

The present invention relates to a system and method embodied in a clock controller for aligning clocks to free running phase holds and for starting, stopping and pulsing the clocks, and in particular to a clock controller for aligning a plurality of N:1 ratioed clocks to free running phase holds and for starting, stooping and pulsing the ratioed clocks in phase with a master clock.

2. Description of the Related Art

Microprocessors commonly use clock signals to drive a variety of logic circuits within the microprocessor. However, not every logic circuit in the microprocessor necessarily runs at the same clock frequency. Consequently, solutions such as using multiple separate clocks, or single clocks using multiple clock dividers or multipliers and phase lock loops (PLL s) have been used to generate a range of clock frequencies to drive the various logic circuits within the microprocessor.

As the complexity and especially the speed of microprocessors and logic elements has increased, the need for clocks that have better phase alignment between sub-clocks generated by a master clock has also increased. Because the performance of microprocessor circuits can increase as the speed and alignment of clock signals improves, there is a clear need for better phase alignment between clock signals running at various frequencies within the microprocessor. Therefore, what is needed is a system and method for phase alignment of a plurality of clock frequencies, or sub-clocks, that allows the sub-docks to be started, stopped, or pulsed in phase with a master clock.

SUMMARY OF THE INVENTION

To overcome the limitations in the related art described above, and to overcome other limitations that will become apparent upon reading and understanding the present application, the present invention is embodied in a clock controller for generating a plurality of phase aligned sub-clocks and for allowing the sub-clocks to be started, stopped, or pulsed in phase with a master clock.

In general, the system and method of the present invention achieves control of the phase alignment of a plurality of ratioed sub-clocks when starting, stopping, and pulsing the sub-clocks. A master clock is preferably input to a clock splitter to provide a plurality of slave clocks. Phase holds, generated by decoding the count of a looping counter, are then used to gate or mask each of the slave clocks to produce ratioed clocks that produce phase aligned clock pulses at lower frequencies which are preferably integer factors of the master clock frequency. Commands to start, stop, or pulse the ratioed clocks may be issued to the clock controller.

Specifically, a plurality of N:1 phase holds are preferably produced by decoding the output of a looping counter. N is preferably an integer value, such that the phase holds may have values such as 1:1, 2:1, 3:1, 4:1, etc. The phase holds are then preferably used to gate the slave clocks to produce a plurality of N:1 ratioed clocks. For example, where N is equal to 2, a 2:1 phase hold is used to gate the slave clock such that for every two clock pulses of the slave clock, a single clock pulse is produced by the 2:1 ratioed clock.

Further, each N:1 rafioed clock is naturally phase aligned with the slave clock with which it is associated because the slave clock is simply gated by the associated phase hold. In addition, because the slave clocks are duplicates of the master clock, each of the ratioed clocks are also naturally phase aligned with the master clock. Therefore, because each of the ratioed clocks is phase aligned with the master clock, they are phase aligned with each other.

Because N is preferably an integer, for each set of ratioed clocks, an integer value M exists such that the N values of each of the ratioed clocks are common denominators of M. As a result, each of the ratioed clocks preferably generates a phase aligned clock pulse simultaneously for every M counts of the looping counter, with the first clock pulse of each ratioed clock occurring at count 0. Further, a total of M÷N clock pulses are preferably generated for each ratioed clock for each M counts of the looping counter.

For example, if M is 12 and one N is 3, the 3:1 ratioed clock will generate a total of 4 clock pulses (12÷3=4) for every 12 counts of the looping counter, starting at count 0, and repeating at count 3, count 6, and count 9 of the looping counter. Count 12 is effectively the same as count 0, as count 0 to count 11 completes one cycle of twelve counts. Further, the looping counter preferably counts to an integer multiple of M so that the state of ratioed clocks may be controlled when sending multiple pulse commands, or start or stop commands either before or after pulse commands to the clock controller.

Precise control of the ratioed clocks is preferably managed by ensuring that each of the phase holds is in the correct alignment when the start, stop, or pulse command is executed. Correct alignment of the phase holds is preferably managed by a function controlled shadow counter which either counts in synchronicity with the master clock, holds the count, or pulses the count depending upon whether a start, stop or pulse command has been issued to the clock controller.

Further, in one embodiment, the clock controller is preferably capable of entering an energy saving mode wherein the shadow counter counts at any integer denominator S of the looping counter, such that the number of clock pulses generated by the ratioed clocks will be divided by S. For example, in the energy saving mode, where the looping counter counts 12 cycles, and S is also equal to 12, the ratioed clocks preferably each generate one clock pulse for every twelve clock pulses that would have been generated by each ratioed clock when the clock controller was not in an energy saving mode. Therefore, any logic circuits or microprocessors driven by the clock controller will use significantly less energy, as they will run at one-twelfth their normal operating speed.

The foregoing and other objects, features and advantages of the invention will be apparent from the following more particular description of a preferred embodiment of the invention, as illustrated in the accompanying drawings wherein like reference numbers represent like parts of the invention.

BRIEF DESCRIPTION OF THE DRAWINGS

Referring now to the drawings in which like reference numbers represent corresponding parts throughout.

DETAILED DESCRIPTION OF THE INVENTION

In the following description of the invention, reference is made to the accompanying drawings, which form a part hereof, and in which is shown by way of illustration a specific example in which the invention may be practiced. It is to be understood that other embodiments may be utilized and structural changes may be made without departing from the scope of the present invention.

Introduction:

The clock controller of the present invention is embodied in a system and method for generating a plurality of phase aligned sub-locks that generate clock pulses in phase with a master clock, and are controlled using start, stop, and pulse commands. In other words, the clock controller of the present invention provides the capability to generate a range of clock frequencies with sub-clocks, such that each of the sub-clocks is in phase with both a master clock and with each other. The master clock is split via a clock splitter to provide a plurality of slave clocks that are phase aligned duplicates of the master clock. Each of these slave clocks is then gated by unique free running phase hold signals to produce a range of phase aligned ratioed clock pulses at a range of clock frequencies that are preferably integer factors of the master clock frequency. The phase aligned ratioed clocks are then controlled using start, stop and pulse commands.

Precise control of the ratioed clocks is preferably managed by ensuring that each of the phase holds is in the correct alignment when the start, stop, or pulse command is executed. Correct alignment of the phase holds is preferably managed by a function controlled shadow counter which either counts in synchronicity with the master clock, holds the count, or pulses the count depending upon whether a start, stop or pulse command has been issued to the clock controller.

Figure 1:
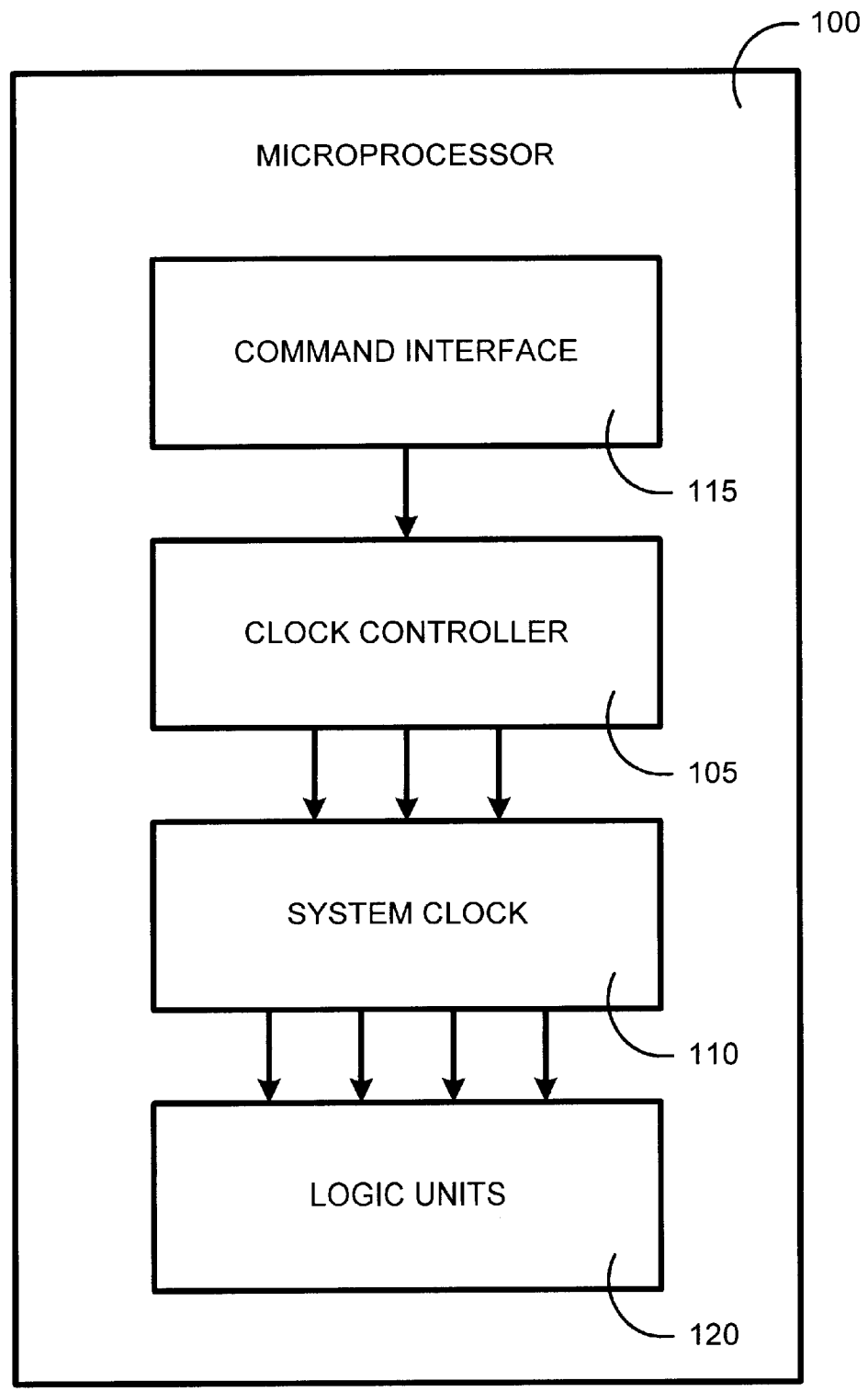
FIG. 1 is a general system diagram illustrating a clock controller in accordance with the present invention in a microprocessor.

System Overview:

FIG. 1 is a general system diagram illustrating an example of a clock controller for generating a plurality of phase aligned clock pulses at a range of frequencies in accordance with the present invention. In this example, the clock controller is embedded in a microprocessor containing a plurality of logic circuits operating at a range of frequencies. Specifically, the microprocessor 100 contains a clock controller 105 that controls a system clock 110 to generate a plurality of ratioed clock pulses at a range of frequencies. The clock controller 105 is preferably controlled via a command interface 115 which preferably provides commands to the clock controller to start, stop or pulse the ratioed clocks. The ratioed clock pulses generated by the clock controller 105 and system clock 110 are used to drive logic units 120 within the microprocessor 100.

While FIG. 1 illustrates a generic case where the clock controller 105 is embedded within a microprocessor 100 containing other logic circuits 120, the clock controller 105 is not limited to this use. For example, the clock controller 105 of the present invention may be implemented as a separate logic circuit on a single chip that could be used in combination with other logic or microprocessor circuits.

Figure 2:
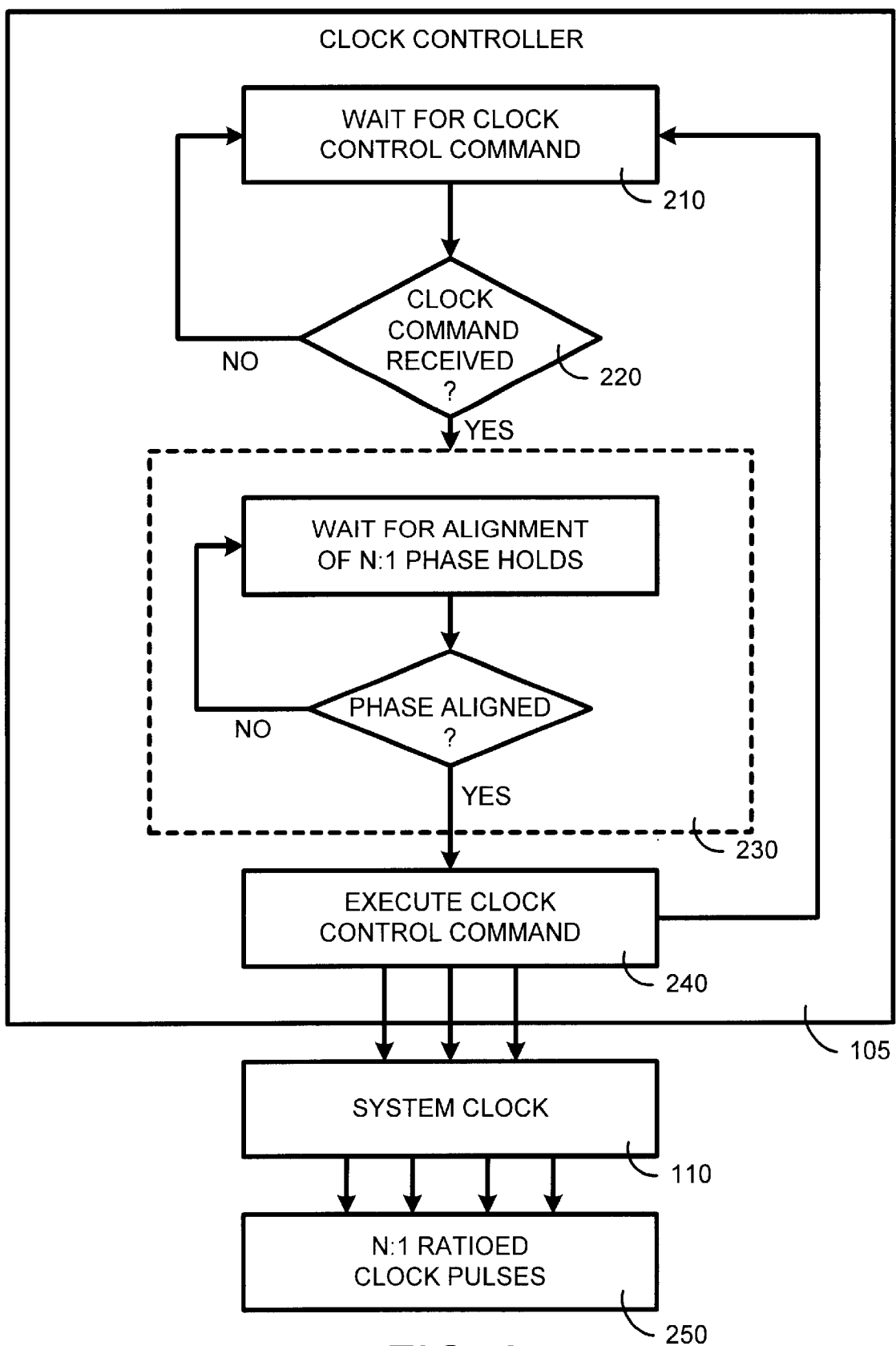
FIG. 2 is a general flow diagram illustrating the operation of the clock controller of FIG. 1.

FIG. 2 is a general flow diagram illustrating the general operation of the clock controller 105 of FIG. 1. FIG. 2 illustrates the clock controller 105 initially waiting for a clock control command (Box 210). Once the clock control command, start, stop, or pulse, is received by the by the clock controller (Box 220), the clock controller 105 then preferably waits until the alignment of the phase holds is correct (Box 230) to execute the clock control command (Box 240). In executing the clock control command, a plurality of phase hold signals and slave clock signals are received by the system clock 110 to generate a plurality of ratioed clock pulses (Box 250).

Operation:

In general, a master clock is preferably input to a clock splitter to provide a plurality of slave clocks. A plurality of N:1 phase holds are then preferably produced by decoding the output of a looping counter. N is preferably an integer value, such that the phase holds may have values such as, for example, 1:1, 2:1, 3:1, 4:1, etc. The phase holds are then preferably used to gate the slave clocks to produce a plurality of N:1 ratioed clocks. For example, where N is equal to 2, a 2:1 phase hold is used to gate the slave clock such that for every two clock pulses of the slave clock, a single clock pulse is produced by the 2:1 ratioed clock.

Further, each N:1 ratioed clock is naturally phase aligned with the slave clock with which it is associated because the slave clock is simply gated by the associated phase hold. In addition, because the slave clocks are duplicates of the master clock, each of the ratioed clocks are also naturally phase aligned with the master clock. Therefore, because each of the ratioed clocks is phase aligned with the master clock, they are phase aligned with each other.

Because N is preferably an integer, for each set of ratioed clocks, an integer value M exists such that the N values of each of the ratioed clocks are common denominators of M. As a result, each of the ratioed clocks preferably generates a phase aligned clock pulse simultaneously for every M counts of the looping counter, with the first clock pulse of each ratioed clock occurring at count 0. Further, a total of M÷N clock pulses are preferably generated for each ratioed clock for each M counts of the looping counter.

For example, if M is 12 and one N is 3, the 3:1 ratioed clock will generate a total of 4 clock pulses (12÷3=4) for every 12 counts of the looping counter, starting at count 0, and repeating at count 3, count 6, and count 9 of the looping counter. Count 12 is effectively the same as count 0, as count 0 to count 11 completes one cycle of twelve counts. Further, the looping counter preferably counts to an integer multiple of M so that the state of ratioed clocks may be controlled when sending multiple pulse commands, or start or stop commands either before or after pulse commands to the clock controller.

Figure 3:
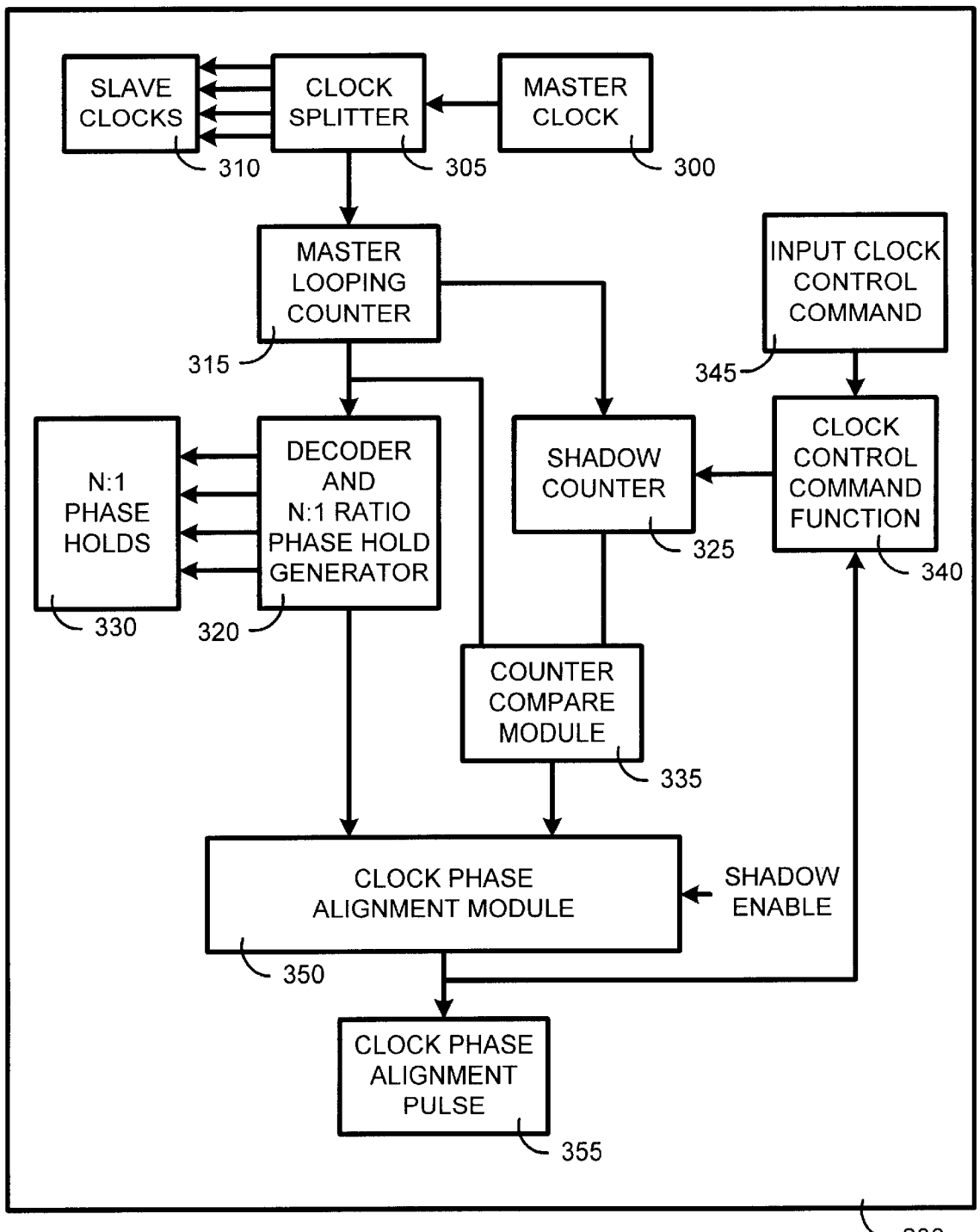
FIG. 3 is a general architectural/functional block diagram illustrating the phase hold generator of FIG. 2.

Specifically, FIG. 3 is a general architectural and functional block diagram that expands on Box 230 of FIG. 2 to illustrate a method for generating slave clocks and phase holds, and for ensuring that the phase alignment between the phase holds is in the correct position prior generating a clock phase alignment pulse to execute the desired clock control command in accordance with the present invention. As illustrated in FIG. 3, a master clock 300 preferably generates clock pulses at a desired frequency. These pulses are preferably duplicated in a clock splitter 305 to create a plurality of phase aligned slave clocks 310 at the same frequency as the master clock. An additional phase aligned duplicate of the master clock is input to a master looping counter 315 which preferably repeatedly counts to an integer multiple of M. This count is preferably provided to both a decoder 320 and a shadow counter 325. The decoder 320, preferably decodes the count of the master looping counter 315 to generate a plurality of N:1 ratio phase holds 330.

The phase holds 330 are preferably generated by comparing the count of the master looping counter 315 to predefined phase hold criteria for the desired phase hold ratios, such as, for example, 1:1, 2:1, 3:1, 4:1, and 6:1. The current state of the individual phase holds is either high or low depending upon the count of the master looping counter 315. Phase holds for each of these ratios are preferably continuously generated and passed to the system clock 110 of FIG. 1 along with the slave clocks 310. In other words, the phase holds 330 are free running, as they preferably continue regardless of whether a start, stop, or pulse order has been issued to the system clock 110 of FIG. 1. Similarly, the slave clocks 310 are also preferably free running.

For a continuously running system clock, there is no need to check the alignment of the phase holds. However, because the system clock, when running, may preferably be stopped and restarted, or simply stopped and pulsed one or more times, followed by an order start the clock, the state of each of the phase holds at the point in time when the clock is ordered stopped, started, or pulsed is preferably known. It is important to know the specific state of each of the phase holds because each of the phase holds is used to generate a ratioed clock running at a specific frequency. If the system clock is stopped at an arbitrary point in time, then restarted or pulsed at an arbitrary point in time, an incorrect number of ratioed clock pulses may be generated. Moreover, this point becomes particularly clear with the situation in which one or more logic units continue to receive clock pulses while other logic units are to be stopped. And more particularly, when logic units, either stopped or running, must maintain an exact tracking of the phase holds generated and distributed to other logic units.

Therefore, when a running system clock is ordered stopped, or a stopped system clock is order started or pulsed, the state of each of the phase holds for the last clock pulse of the master clock when the system clock last ran, is preferably stored in a register or array. Consequently, when either restarting or pulsing the system clock, the order to restart or pulse will be delayed until the phase holds are each in the state that that they would have been in on the next master clock pulse following the point at which the system clock was last stopped or pulsed.

Alignment of the phase holds in the proper position following a start or pulse command is accomplished by incrementing the shadow counter 325, then comparing the count of the shadow counter 325 to the count of the master looping counter 315 in a count compare module 335. The shadow counter 325 is incremented in response to an order from a clock control command function module 340 which processes the clock control command 345 input from the command interface 115 of FIG. 1 in combination with the current phase hold state, and the last phase hold state when the system clock last ran. The phase hold state information is provided to the clock control command function 340 by the clock phase alignment module 350. The phase hold alignment module 350 preferably determines the phase hold state information by receiving inputs from the phase hold generator 320 and the counter compare module 335. When the phase holds are properly aligned, a clock phase alignment pulse 355 is generated and the clock control command is executed (Box 240, as shown in FIG. 2). The system clock 110 (as shown in FIG. 1) then processes the slave clocks with the phase holds to produce the N:1 rafioed clock pulse or pulses which are then distributed to the logic elements 120 (as shown in FIG. 1).

Further, in one embodiment, the clock controller 105 (as shown in FIG. 1) is preferably capable of entering an energy saving mode wherein the shadow counter 325 counts at any integer factor S of the master looping counter 315, such that the number of clock pulses generated by the ratioed clocks will be divided by S. For example, in the energy saving mode, where the looping counter 315 counts 12 cycles, and S is also equal to 12, the ratioed clocks preferably each generate one clock pulse for every twelve clock pulses that would have been generated by each ratioed clock when the clock controller was not in an energy saving mode. Therefore, any logic circuits or microprocessors driven by the clock controller 105 will use significantly less energy, as they will run at one-twelfth their normal operating speed.

Working Example:

The following description is for illustrative purposes only and describes a clock controller in accordance with the present invention. It should be noted that although the following description involves a clock controller having five ratioed clocks, any number of phase holds may be used to create any number of ratioed clocks.

Figure 4:
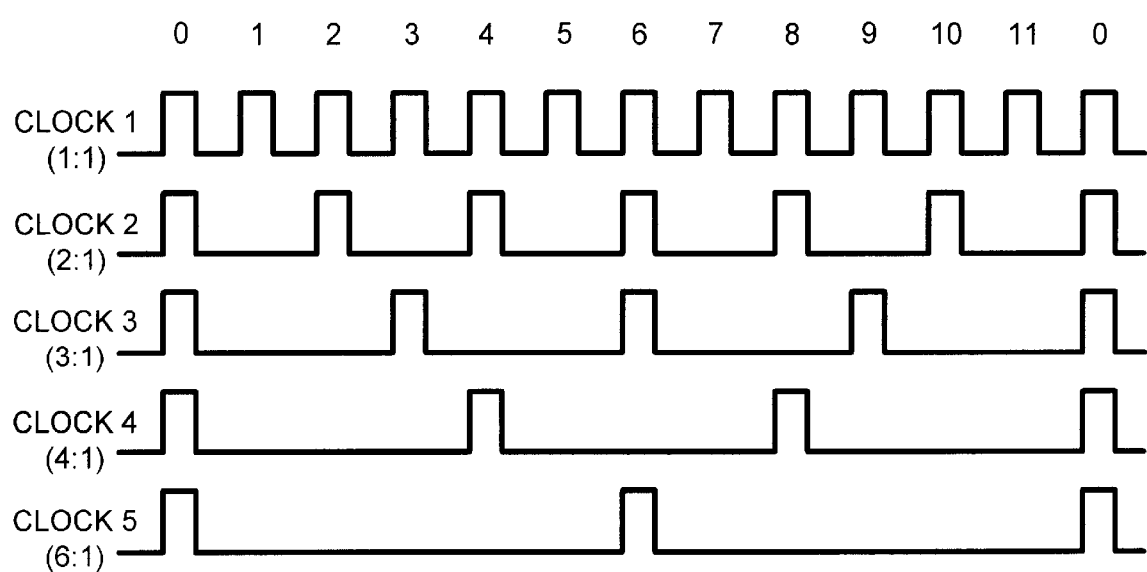
FIG. 4 is a state diagram showing clock pulses for a working example of a plurality of N:1 ratioed clocks.

Thus, an exemplary clock controller in accordance with the present invention, uses five phase holds: 1:1, 2:1, 3:1, 4:1, and 6:1. FIG. 4 is a state diagram that illustrates the state of the ratioed clocks produced by each of these phase holds over a complete cycle of M counts, where M is equal to 12 as the least common multiple of {1, 2, 3, 4, and 6}. Consequently, as described above, at count 0, each of the ratioed clocks will generate a clock pulse. All of the phase holds will again line up at count 12, which is effectively the same as count 0, so that each of the ratioed clocks will again generate a clock pulse. Table 1 below summarizes the clock pulse results illustrated in FIG. 4.

TABLE 1

| Phase Hold Ratio | Master Looping Counter Count | | | | | | | | | | | | |
|---|---|---|---|---|---|---|---|---|---|---|---|---|---|
| | 0 | 1 | 2 | 3 | 4 | 5 | 6 | 7 | 8 | 9 | 10 | 11 | 0 |
| | Clock Pulse Generated? | | | | | | | | | | | | |
| 1:1 | Y | Y | Y | Y | Y | Y | Y | Y | Y | Y | Y | Y | Y |
| 2:1 | Y | | Y | | Y | | Y | | Y | | Y | | Y |
| 3:1 | Y | | | Y | | | Y | | | Y | | | Y |
| 4:1 | Y | | | | Y | | | | Y | | | | Y |
| 6:1 | Y | | | | | | Y | | | | | | Y |

Figure 5:
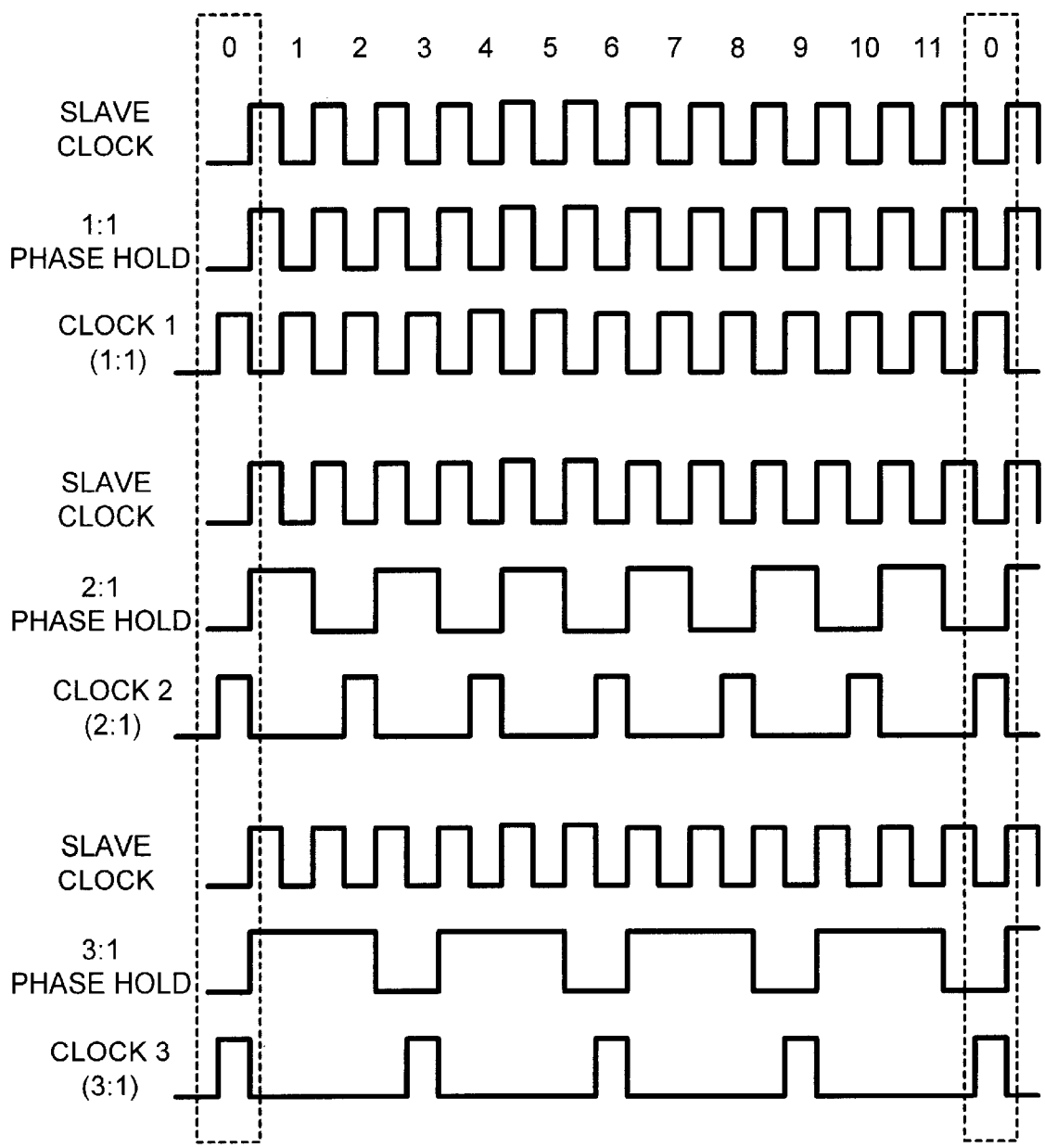
FIG. 5 is a state diagram showing the slave clocks, phase holds, and clock pulses for a subset of the N:1 ratioed clocks of FIG. 4.

FIG. 5 is a state diagram that shows the slave clocks, phase holds, and clock pulses for a subset of the N:1 ratioed clocks of FIG. 4 over a complete cycle of M counts, where M is equal to 12 as discussed above. As can be seen from this state diagram, a clock pulse is preferably generated for a particular N:1 ratioed sub-clock when the states of both the slave clock and the phase hold are low. When the state of both the slave clock and the phase hold are high, the state of the N:1 ratioed sub-clock preferably goes low to terminate the clock pulse.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A method for aligning the phase of at least one clock signal to a master clock, comprising:
   waiting for alignment of at least one phase hold signal;
   combining at least one phase hold signal to at least one slave clock signal to generate at least one phase aligned sub-clock signal; and wherein waiting for the alignment of at least one phase hold signal comprises waiting until the count of a first looping counter is the same as the count of a second looping counter.

2. The method of claim 1 wherein the count of the second looping counter is incremented with each clock pulse of at least one of the phase aligned sub-clock signals.

3. A method for aligning the phase of at least one clock signal to the phase of a master clock, comprising:

splitting a master clock to generate at least one phase aligned sub-clock;

generating at least one continuously running phase hold signal by decoding the count of a first counter; and masking each sub-clock with each of the phase hold signals to generate at least one phase aligned clock signal.

4. The method for generating at least one phase aligned clock signal of claim 3 wherein the specific position of the phase aligned signals is determined by comparing the count of the first counter to a second counter.

5. The method for comparing the count of the first counter to the second counter of claim 4 wherein the count of the first counter increments for each clock pulse of one of the slave clocks.

6. The method for comparing the count of the first counter to the second counter of claim 4 wherein the count of the second counter increments for each count of the first counter when the phase aligned sub-clocks are running.

7. The method for comparing the count of the first counter to the second counter of claim 4 wherein the count of the second counter increments each time the phase aligned sub-clocks are pulsed.

8. The method for aligning the phase of at least one clock signal of claim 3 wherein each of the phase aligned clock signals may be run continuously by ordering a clock controller to start the clock signals.

9. The method for aligning the phase of at least one clock signal of claim 3 wherein each of the phase aligned clock signals may be stopped by ordering a clock controller to stop the clock signals.

10. The method for aligning the phase of at least one clock signal of claim 3 wherein each of the phase aligned clock signals may be pulsed by ordering a clock controller to pulse the clock signals.

11. The method for ordering the clock controller to start the clock signals of claim 5 wherein the clock controller waits until the phase of each of the phase aligned clock signals is in a specific position before starting the clock signals.

12. The method for ordering the clock controller to pulse the clock signals of claim 7 wherein the clock controller waits until the phase of each of the phase aligned clock signals is in a specific position before pulsing the clock signals.

13. The method of generating at least one phase aligned clock signal of claim 3 wherein each of the phase aligned clock signals are integer factors of the master clock signal.

14. The method for generating at least one phase aligned clock signal of claim 13 wherein the looping counter counts to an integer multiple of the lowest common multiple of the integer factors of the master clock signal.

15. The method for aligning the phase of at least one clock signal of claim 3 wherein each of the phase aligned clock signals may be run continuously in an energy saving mode at a rate slower than a normal operating speed.

16. A system for phase alignment of at least one clock signal, comprising:

a clock splitter for generating at least one continuously running slave clock signals from a first clock signal, wherein each of the at least one slave clock signals are phase aligned to the first clock signal;

a first counter coupled to the clock splitter, wherein the count of the first counter is incremented for each clock pulse of one of the slave clock signals;

a phase hold generator coupled to the first counter for decoding the count of the first counter and generating at least one continuously running phase hold signal; and a second clock for generating at least one phase aligned clock signal by combining each of the at least one slave clock signals with one of each of the at least one phase hold signals, and wherein each of the phase aligned clock signals are phase aligned to the first clock signal.

17. The system of claim 16 further comprising a clock controller coupled to the second clock for receiving and processing orders to start, stop, and pulse each of the at least one phase aligned clock signals.

18. The system of claim 17 further comprising a second counter coupled to the first counter and to the clock controller, and wherein the specific positions of each of the at least one phase aligned clock signals are determined by comparing the counts of the first and second counters.

19. The system of claim 18 wherein the count of the second counter is incremented with each count of the first counter while each of the at least one phase aligned clock signals are running.

20. The system of claim 18 wherein the count of the second counter is incremented with each pulse of each of the at least one phase aligned clock signals.

21. The system of claim 18 wherein orders to start and pulse each of the at least one phase aligned clock signals are held until each of the at least one phase aligned clock signals are in a specific position.

22. The system of claim 16 wherein frequencies of each of the at least one phase aligned clock signals are integer factors of a frequency of the first clock signal.

23. The system of claim 16 wherein each of the phase aligned clock signals may be run continuously in an energy saving mode at a rate slower than a normal operating speed.

* * * * *